(12) United States Patent
Gallagher et al.

(10) Patent No.: US 12,196,788 B2
(45) Date of Patent: Jan. 14, 2025

(54) PRESSURE CONTROL APPARATUS ACTIVATION MONITORING

(71) Applicant: Kinetic Pressure Control Ltd., Houston, TX (US)

(72) Inventors: Billy Gallagher, Houston, TX (US); Bobby J. Gallagher, Houston, TX (US); Steven A. Angstmann, Houston, TX (US); Gordon Wilkins, II, Houston, TX (US)

(73) Assignee: Kinetic Pressure Control Ltd., Houston, TX (US)

( * ) Notice: Subject to any disclaimer, the term of this patent is extended or adjusted under 35 U.S.C. 154(b) by 236 days.

(21) Appl. No.: 17/780,977

(22) PCT Filed: Dec. 12, 2020

(86) PCT No.: PCT/US2020/064719
§ 371 (c)(1),
(2) Date: May 28, 2022

(87) PCT Pub. No.: WO2021/119560
PCT Pub. Date: Jun. 17, 2021

(65) Prior Publication Data
US 2023/0003770 A1 Jan. 5, 2023

Related U.S. Application Data

(60) Provisional application No. 62/947,489, filed on Dec. 12, 2019.

(51) Int. Cl.
*G01R 19/00* (2006.01)
*E21B 33/035* (2006.01)
(Continued)

(52) U.S. Cl.
CPC ...... *G01R 19/0092* (2013.01); *E21B 33/0355* (2013.01); *E21B 33/064* (2013.01); *E21B 47/001* (2020.05)

(58) Field of Classification Search
CPC ............. G01R 19/0092; E21B 33/0355; E21B 33/064; E21B 47/001; E21B 34/16
See application file for complete search history.

(56) References Cited

U.S. PATENT DOCUMENTS

2018/0274319 A1* 9/2018 Lycke ................. E21B 33/0355

OTHER PUBLICATIONS

International Search Report and Written Opinion of the International Searching Authority, International Application No. PCT/US2020/064719, dated Mar. 11, 2021.

\* cited by examiner

*Primary Examiner* — Farhana A Hoque
(74) *Attorney, Agent, or Firm* — Victor H. Segura

(57) ABSTRACT

An initiator monitoring and actuating system includes a first power supply selectively electrically connectable to a charge initiator. The first power supply provides a current lower than an activation current of the initiator. A second power supply is selectively electrically connectable to the charge initiator. The second power supply provides a current of at least the activation current. Switches are selectively operable to connect the second power supply to a test circuit operable to measure a current generated by the second power supply. The switches are selectively operable to connect the second power supply to the charge initiator. A current sensor is operable to measure current through the test circuit and operable to measure current from the first power supply when the first power supply is connected to the charge initiator.

13 Claims, 3 Drawing Sheets

(51) Int. Cl.
*E21B 33/064* (2006.01)
*E21B 47/001* (2012.01)

PRESSURE CONTROL APPARATUS ACTIVATION MONITORING

CROSS REFERENCE TO RELATED APPLICATIONS

Continuation of International Application No. PCT/US2020/064719 filed on Dec. 12, 2020. Priority is claimed from U.S. Provisional Application No. 62/947,489 filed on Dec. 12, 2019. Both foregoing applications are incorporated herein by reference in their entirety.

BACKGROUND

Blowout preventers (BOPs) for oil and gas wells are used to prevent potentially catastrophic events known as blowouts, where high well pressures and uncontrolled flow from a subsurface formation into the well can expel tubing (e.g., drill pipe and well casing), tools and drilling fluid out of a well. Blowouts present a serious safety hazard to drilling crews, the drilling rig and the environment, and can be extremely costly. Typically, BOPs have "rams" that are opened and closed by actuators. The most common type of actuator is operated hydraulically to push closure elements across a through bore in a BOP housing (itself sealingly coupled to the well) close the well. In some cases the rams have hardened steel shears to cut through a drill string or other tool or device which may be in the well at the time it is necessary to close the BOP.

In typical operational use, unless a problem is detected with an installed BOP, the BOP system is typically left in place for an extended period of time. FIG. 1 shows a conventional BOP stack 10 mounted to a wellhead 12 disposed at the sea floor 14. A riser 16 is coupled in between the BOP stack 10 and a floating platform 18 to provide a conduit for the drilling fluid return during well construction and for hydrocarbons and other fluids produced from a completed subsea well drilled beneath the sea floor 14. Signal and data communication between the platform 18 and the BOP stack 10 is typically accomplished via a multiplex or MUX cable 22 extending along the riser 16 linking the platform 18 and BOP stack 10.

Pyrotechnic based BOPs have been proposed which address shortcomings of conventional hydraulic BOPs. U.S. Pat. No. 10,465,466 issued to Angstmann et al. and assigned to Kinetic Pressure Control Limited describes such pyrotechnic BOPs. Although pyrotechnic based BOPs provide significant advantages compared to conventional BOPs, a need remains for means to monitor and test the ignition or activation mechanisms of such pyrotechnic based BOPs to ensure operational integrity.

SUMMARY

An initiator monitoring and actuating system according to one aspect of this disclosure includes a first power supply selectively electrically connectable to a charge initiator. The first power supply providing a current lower than an activation current of the initiator. A second power supply sis electively electrically connectable to the charge initiator. The second power supply providing a current of at least the activation current. Switches are selectively operable to connect the second power supply to a test circuit operable to measure a current generated by the second power supply. The switches are selectively operable to connect the second power supply to the charge initiator. A current sensor is operable to measure current through the test circuit and operable to measure current from the first power supply when the first power supply is connected to the charge initiator.

An initiator monitoring and actuating system according to another aspect of this disclosure includes a power supply selectively electrically connectable to a charge initiator through a first circuit to provide a current lower than an activation current of the initiator. The power supply is selectively electrically connectable to the charge initiator through a second circuit to provide a current of at least the activation current. Switches are selectively operable to connect the power supply to a third circuit disconnected from the initiator to provide current of at least the activation current. A current sensor is operable to measure current through the first circuit and the third circuit.

A method according to another aspect of this disclosure relates to a method for monitoring and actuating an initiator circuit by coupling a power supply to a charge initiator through a first circuit to provide a current lower than an activation current of the initiator. The power supply is selectively electrically connectable to the charge initiator through a second circuit to provide a current of at least the activation current. At least one switch is activated to connect the power supply to a third circuit disconnected from the initiator to provide current of at least the activation current. A current through the first circuit and the third circuit is measured using a current sensor.

Other aspects and advantages will be apparent from the description and claims that follow.

DETAILED DESCRIPTION

Figure 1:
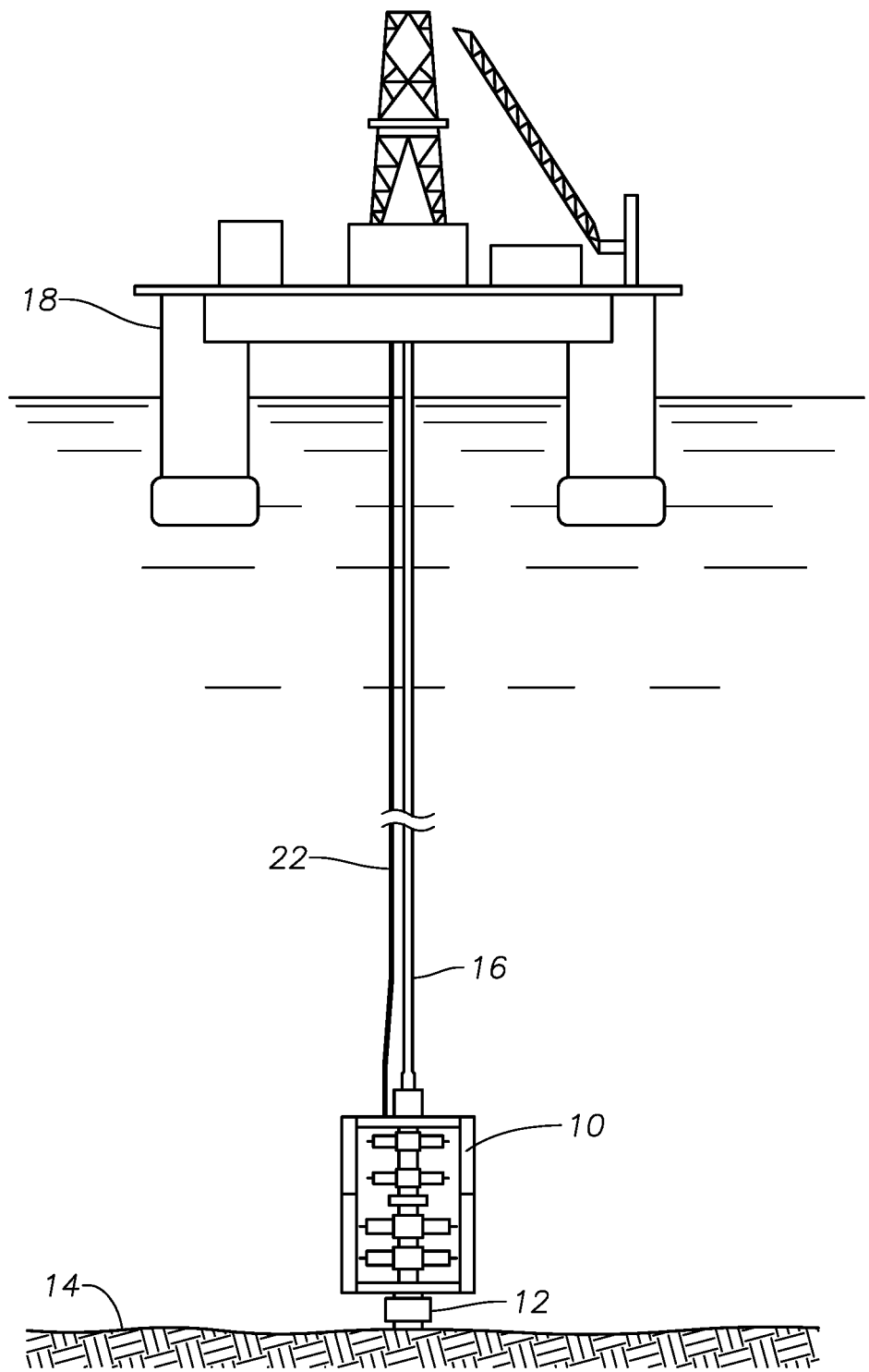
FIG. 1 shows a blowout preventer (BOP) stack coupled to a subsea wellhead, connected to a platform by a riser.

Illustrative embodiments are disclosed herein. In the interest of clarity, not all features of an actual implementation are described. In the development of any such actual implementation, numerous implementation-specific decisions may need to be made to obtain design-specific goals, which may vary from one implementation to another. It will be appreciated that such a development effort, while possibly complex and time-consuming, would nevertheless be a routine undertaking for persons of ordinary skill in the art having the benefit of this disclosure. The disclosed embodiments are not to be limited to the precise arrangements and configurations shown in the figures, in which like reference numerals may identify like elements. Also, the figures are not necessarily drawn to scale, and certain features may be shown exaggerated in scale or in generalized or schematic form, in the interest of clarity and conciseness.

Figure 2:
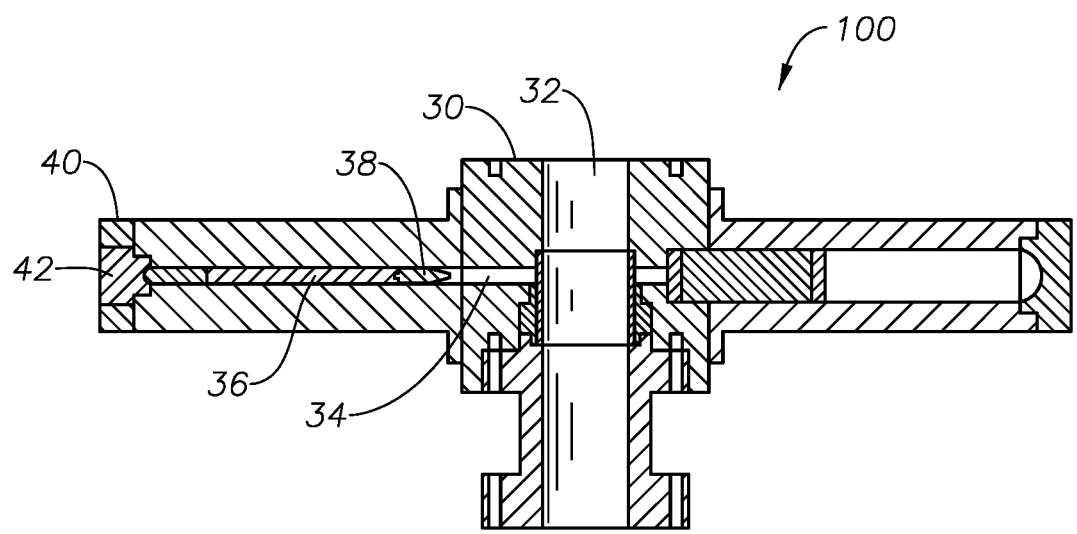
FIG. 2 shows shows a cross section view of an example embodiment of a pyrotechnic based BOP.

FIG. 2 shows a cross section view of an example embodiment of a pyrotechnic based BOP 100 according the present disclosure. The BOP 100 has a main body 30 having a through bore 32. The BOP 100 also has a passage 34 that is transverse to the through bore 32. A shearing device 36 having a cutting edge 38 is located in the passage 34 on one side of the through bore 32. An end cap 40 closes off the passage 34 at one lateral end of the BOP 100. A charge 42, which may be in the form of a chemical propellant, is deposed on the end cap 40.

Figure 3:
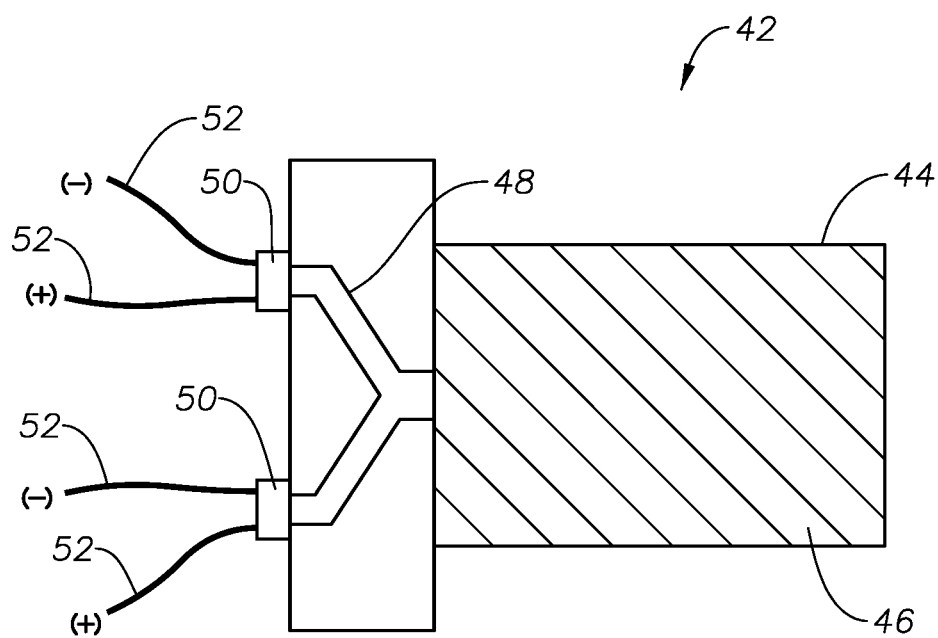
FIG. 3 shows an example embodiment of a charge according to this disclosure.

FIG. 3 shows an example embodiment of a charge 42 according to this disclosure. The charge 42 may have a generally cylindrical body 44 which houses a chemical propellant 46. An end of the charge 42 is configured with an internal Y-shaped port 48 leading to a pair of initiators 50. Two initiators 50 are used for operational redundancy. Each initiator 50 has its own separate activation circuit (described below). Conventional chemical propellants 46 may be used in implementations of the embodiments as known in the art. Conventional electrically-activated initiators 50 may also be used as known in the art. When activated via an electrical signal across electrical leads 52, the initiator 50 ignites the chemical propellant 46. Once ignited, the chemical propellant 46 produces high-pressure gases which propel the shearing device (36 in FIG. 2) along the passage (34 in FIG. 2) and across the through bore (32 in FIG. 2) to shear anything in the through bore (32 in FIG. 2), as described in greater detail in U.S. Pat. No. 10,465,466 referred to herein above.

In operation, activation of the BOP 100 to clear and seal the through bore (32 in FIG. 2) is triggered only when it is imperative to immediately close off fluid flow from the well (FIG. 1) via the through bore (32 in FIG. 2, e.g., an imminent well pressure control event). Once ignited, the chemical propellant 46 is consumed as it produces the high-pressure gases to propel the shearing device (36 in FIG. 2). Therefore, activation of an initiator 50 to ignite the chemical propellant 46 is a one-time event that is triggered only in critical or emergency situations when it is vital to maintain pressure control of the well.

Figure 4:
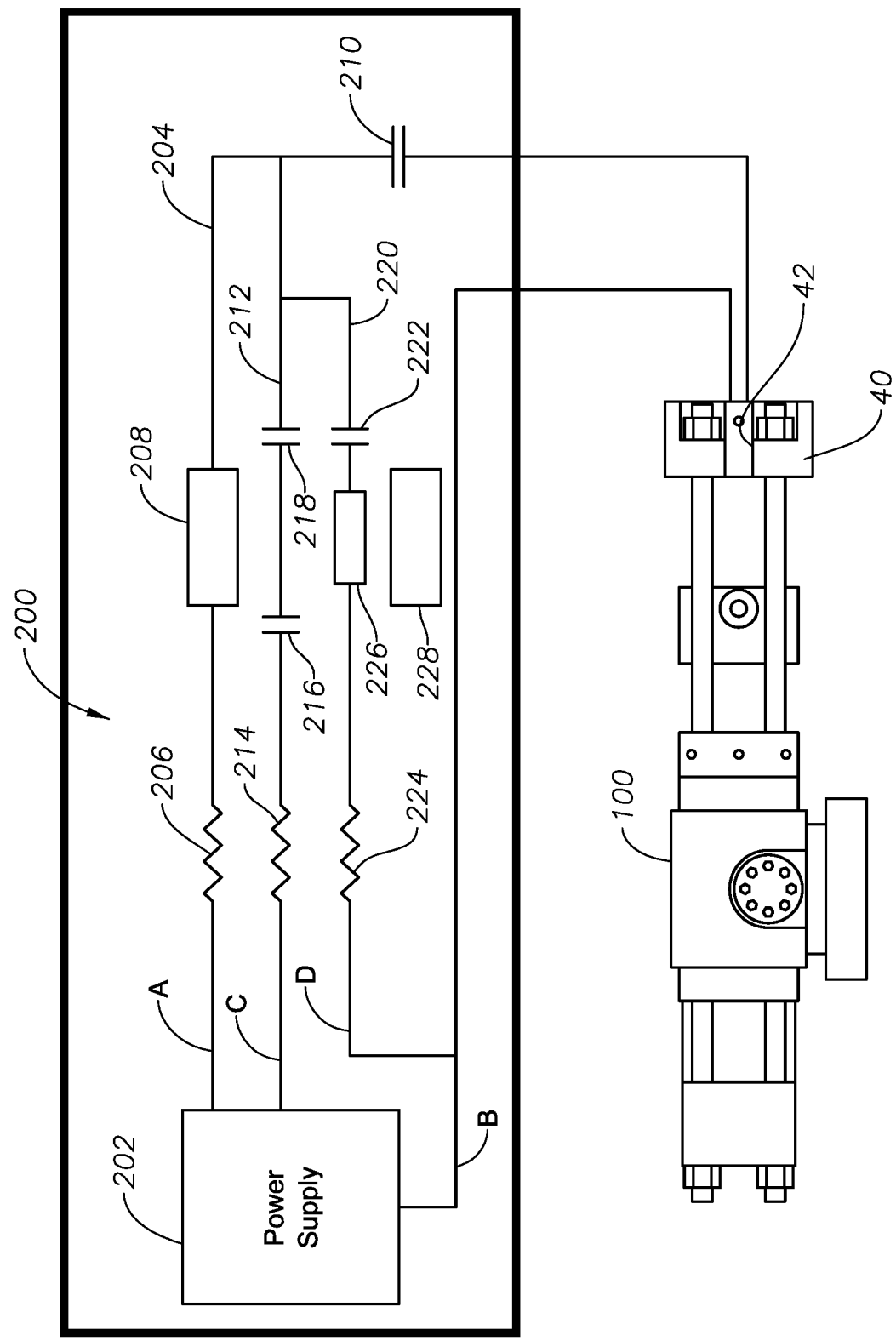
FIG. 4 shows an example embodiment of an electrical circuit according to this disclosure.

The critical nature of the BOP 100 to the overall safety of well operations requires inspection, monitoring, and testing of the system to ensure proper operation in the event activation is necessary. FIG. 4 shows an example embodiment of an electrical circuit 200 according to this disclosure. The electrical circuit 200 includes a power supply 202 (DC voltage). It will be appreciated that the electrical circuit may be electrically connected to devices on the platform (18 in FIG. 1) using, e.g., the MUX cable (220 in FIG. 1) wherein control signals may be sent to the electrical circuit 200 and sensor signals may be communicated to the devices on the platform.

In some embodiments, the power supply 202 may comprise one or more batteries or may be a remote source electrically coupled to the electrical circuit 200 to provide power. One circuit leg A links one terminal of the power supply 202 to one lead (e.g., 52 (+) in FIG. 3) of each initiator (50 in FIG. 3). Another circuit leg B links another terminal of the power supply 202 to the other lead (e.g., 52 (−) in FIG. 3) of each initiator (50 in FIG. 3), providing a current return and forming a first closed circuit 204. The first closed circuit 204 may include a resistor 206, a programmable logic controller (PLC) 208, and a switch or relay 210. The first closed circuit 204 may be configured to provide a constant, low amperage current through one or both initiators (50 in FIG. 3). Such current may be obtained, for example, by suitable selection of the value of resistor 206. The constant, low amperage current running through first closed circuit 204 is kept below the activation current needed to ignite the initiators (50 in FIG. 3). In this manner, the first closed circuit 204 may be used to monitor the closed-circuit status of the activation system to ensure circuit integrity.

Another circuit leg C may link one terminal of the power supply 202 to one lead (e.g., 52 (+) in FIG. 3) of each initiator 50 (see FIG. 3). Circuit leg B remains linked to the other terminal of the power supply 202 and to the other lead (e.g., 52 (−) in FIG. 3) of each initiator (50 in FIG. 3), providing a second closed circuit 212 when switch or relay 210 is closed. The second closed circuit 212 includes a resistor 214, and a pair of switches or relays 216, 218. The second closed circuit 212 may be configured, such as by suitable selection of a value of resistor 214 to provide a current of enough amperage to activate and ignite the initiator(s) (50 in FIG. 3). The second closed circuit 212 is powered only when it is desired to ignite the chemical propellant 46 (see FIG. 3).

Another circuit leg D is coupled into the second closed circuit 212 as shown in FIG. 4. This circuit leg D terminates at the other terminal of the power supply 202 (the terminal end may be coupled directly to the power supply 202 or linked into circuit leg B as shown in FIG. 4) providing a third closed circuit 220 when a switch or relay 222 is closed. The third closed circuit 220 also includes a resistor 224 and a shunt (current) meter 226. When switch or relay 210 is open and the third closed circuit 212 is energized with current sufficient to ignite an initiator 50, the third closed circuit 220 forms the closed circuit for the return terminal to the power supply 202. In this manner, switch or relay 210 may be selectively opened and an initiator fire-test current passed through second and third closed circuits 212 and 220 to test system integrity without activating the initiator(s). In some embodiments, an inductive current/voltage-configured programmable logic controller 228 may be disposed proximate circuit 220 to determine the current on the various circuit legs as known in the art.

Operation of the switches 210, 216, 218, 222 may be performed by the PLC 208 either or both autonomously and/or by commands sent from the surface. Measurements made by the shunt meter 226 and the inductive current/voltage-configured programmable logic controller 228 may be communicated to the surface, e.g., over the MUX cable (22 in FIG. 1).

Although the power supply 202 is shown in FIG. 4 and is described as a single power supply, some embodiments may comprise more than one power supply. In some embodiments, there may be a first, low current power supply connectible to circuit legs A and B, where the first power supply can only provide current below the activation level of the initiator(s). Such current may be limited by appropriate selection of the resistor 206 in current leg A, or an equivalent or additional resistor in circuit leg B. Correspondingly, a second power supply may provide activation current to circuit legs A and B, when suitable switches are closed, and suitable selection of value of resistor 214 in circuit leg C. Thus, the operation of the monitoring and activation system may result from suitable selection of power supplies, or, as shown in FIG. 4, by a single power supply and suitable values of resistors 206 and 214 to provide appropriate current for monitoring, testing and activation of the initiator(s).

Embodiments according to this disclosure allow one to monitor and test ignition systems a disclosed. In light of the principles and example embodiments described and illustrated herein, it will be recognized that the example embodiments can be modified in arrangement and detail without departing from such principles. It will be appreciated by those skilled in the art that embodiments of this disclosure may be implemented using conventional materials, hardware, and components (e.g. suitable conventional seals) as known in the art. Although the foregoing discussion has focused on particular embodiments, any embodiment is freely combinable with any one or more of the other embodiments disclosed herein, and any number of features of different embodiments are combinable with one another, unless indicated otherwise.

What is claimed is:

1. A blowout preventer (BOP) initiator monitoring and actuating system, comprising:
    a charge linked to the BOP and configured for ignition to propel a shearing device disposed on the BOP;
    a first power supply selectively electrically connectable to a charge initiator linked to the charge, the first power supply providing a current lower than an activation current of the initiator;
    a second power supply selectively electrically connectable to the charge initiator, the second power supply providing a current of at least the activation current;
    switches selectively operable to connect the second power supply to a test circuit operable to measure a current generated by the second power supply, the switches selectively operable to connect the second power supply to the charge initiator; and
    a current sensor operable to measure current through the test circuit and operable to measure current from the first power supply when the first power supply is connected to the charge initiator.

2. The system of claim 1 wherein the charge comprises a plurality of charge initiators disposed thereon.

3. The system of claim 1 wherein the charge initiator is set to ignite the charge when the activation current is applied to the charge initiator.

4. The system of claim 1 wherein the first power supply, the second power supply, or both power supplies are located remote from the charge initiator.

5. The system of claim 1 wherein the charge comprises a chemical propellant.

6. The system of claim 1 wherein the charge is suitable for disposal under water.

7. A blowout preventer (BOP) initiator monitoring and actuating system, comprising:
    a charge linked to the BOP and configured for ignition to propel a shearing device disposed on the BOP;
    a power supply selectively electrically connectable to a charge initiator linked to the charge through a first circuit to provide a current lower than an activation current of the initiator;
    the power supply selectively electrically connectable to the charge initiator through a second circuit to provide a current of at least the activation current;
    switches selectively operable to connect the power supply to a third circuit disconnected from the initiator to provide current of at least the activation current; and
    a current sensor operable to measure current through the first circuit and the third circuit.

8. The system of claim 7 wherein the charge comprises a plurality of charge initiators disposed thereon.

9. The system of claim 7 wherein the charge initiator is set to ignite the charge when the activation current is applied to the charge initiator.

10. The system of claim 7 wherein the power supply is located remote from the charge initiator.

11. The system of claim 7 wherein the charge comprises a chemical propellant.

12. The system of claim 7 wherein the charge is suitable for disposal under water.

13. A method for monitoring and actuating a blowout preventer (BOP) initiator circuit, comprising:
    disposing a charge linked to the BOP, the charge configured for ignition to propel a shearing device disposed on the BOP;
    coupling a power supply to a charge initiator linked to the charge through a first circuit to provide a current lower than an activation current of the initiator;
    the power supply selectively electrically connectable to the charge initiator through a second circuit to provide a current of at least the activation current;
    activating at least one switch to connect the power supply to a third circuit disconnected from the initiator to provide current of at least the activation current; and
    measuring current through the first circuit and the third circuit using a current sensor.

* * * * *